United States Patent [19]
Smith

[11] Patent Number: 5,754,409
[45] Date of Patent: May 19, 1998

[54] FOLDABLE ELECTRONIC ASSEMBLY MODULE

[75] Inventor: Gary W. Smith, San Diego, Calif.

[73] Assignee: Dynamem, Inc., San Diego, Calif.

[21] Appl. No.: 744,595

[22] Filed: Nov. 6, 1996

[51] Int. Cl.⁶ ........................................... H05K 1/14
[52] U.S. Cl. ................ 361/803; 174/254; 361/749; 361/784; 361/789; 439/67; 439/77
[58] Field of Search ........................... 174/254, 268; 361/749–751, 784, 785, 789, 790, 803, 804; 439/67, 77, 493, 492, 541.5, 591, 629, 631, 632, 951

[56] References Cited

U.S. PATENT DOCUMENTS

| | | |
|---|---|---|
| 3,971,127 | 7/1976 | Giguere et al. ........................ 361/749 |
| 4,742,183 | 5/1988 | Soloway et al. ........................ 174/254 |
| 5,224,023 | 6/1993 | Smith et al. ........................... 361/784 |

*Primary Examiner*—Donald Sparks
*Attorney, Agent, or Firm*—Wolf, Greenfield & Sacks, P.C.

[57] ABSTRACT

A foldable electronic assembly is provided with extending ears for protecting folded substrates in flexible areas and with elements between adjacent face-to-face boards to maintain selected spacing between the boards while mechanically holding adjacent boards together. Elements may also be provided in the area of the ears which are adapted to coact with a suitable tool to facilitate removal of the assembly from a mating connector.

19 Claims, 3 Drawing Sheets

FOLDABLE ELECTRONIC ASSEMBLY MODULE

FIELD OF THE INVENTION

This invention relates to the art of electronic circuit packaging, and more specifically, to the packaging of high density integrated circuits on printed circuit boards plugged into a mother board.

BACKGROUND OF THE INVENTION

U.S. Pat. No. 5,224,023 which issued to Gary W. Smith on Jun. 29, 1993 (the '023 patent) discloses a foldable electronic assembly module which provides compact packaging for memory modules and other electronic circuit components. While the modules of this patent are a significant step forward in the art, some problems have been experienced in using these modules. First, as may be seen from FIGS. 1 and 2, each module 10A, 10B is formed by folding rigid-flex circuit boards over at their junctions/flexible sections and by then securing the rigid sections together with posts or wires which are soldered at their ends in corresponding feed-through holes. The result of this is that the flexible sections 22 of the boards are exposed on their tops and sides and are therefore subject to being cracked or damaged during movement or handling of the modules or of the boards 15 in which they are mounted. Damage to the exposed flexible portions is of particular concern when modules are being inserted or removed from a connector 14 on a board 15 since the flex sections 22 are the most prominent element at the top of the board. With the prior art modules, insertion and removal is typically performed by grasping the sides of rigid portions of the module and either pressing down or rocking the module into the connector for insertion or rocking and pulling on the module to free it from the connector for removal. The problems of insertion and removal of modules will increase as the number of pins on the module increases, increasing the friction for insertion and removal. For example, for memory modules, this will become a problem as the standard evolves from the 72 pin SIMM standard to the emerging 168 pin DIMM standard. A need therefore exists for an improved design for these modules which both protects the flex sections 22 during handling, including insertion and removal of the modules, and which also facilitates insertion and removal of the modules so as to prevent damage to all areas of the module, including the flex areas, during these operations.

Further, the posts or wires 24 and the solder junctions 26 permit some relative movement between adjacent rigid sections of a module. As a result, shock or vibration on the modules which can occur as a result of normal use or handling can lead to broken wires 24 or to failed solder joints 26. Either of these problems can render a module unusable and require either the disposal of the module or expensive repair, either of which options is undesirable. A need therefore exists for an improved technique for securing the rigid sections of the modules so as to reduce relative movement between these sections during use and handling and to render the modules more resistant to damage from shock and vibration resulting from such use and handling.

SUMMARY OF THE INVENTION

In accordance with the above, this invention provides an electronic assembly to be mounted in a corresponding connector on a mother board and a method for the fabrication thereof. The assembly may utilize a single layer or multi-layer rigid-flex board. At least one flexible insulating substrate is provided, depending on the type of board, with a network of conductive leads and connecting stations formed thereon. The at least one substrate is sandwiched between at least first and second substantially rigid circuit boards. Each of the boards has pads for selectively mounting electronic components. A connecting comb or other suitable connecting element is provided at one end of the assembly which is sized to mate with the connector on the mother board and electrical connections are suitably established between the pad and the stations on the substrate. At least one gap is formed in each of the circuit boards, the gaps in the boards being aligned to form a flexible section long enough to allow mounting of the boards in a parallel, face-to-face, layered arrangement by folding the substrate at each gap. Further, the gaps are of full length for the width of the substrate which width is narrower on each side thereof then the boards for at least some of the gap, and slightly beyond, but are otherwise of much shorter length so as to provide a pair of ears formed on each board on either side of the substrate, which ears extend above the height of a folded substrate at the gap and protect the folded substrate. Elements are provided in the area of at least selected ones of the ears which are adapted to coact with a suitable tool to facilitate the removal of the assembly from the mother board connector. For a preferred embodiment, the element is a hole formed in each of the ears. The element may also be a post extending between adjacent boards and attached to the boards.

For preferred embodiments, at least one element is provided for maintaining a selected spacing between adjacent face-to-face boards and for mechanically holding the adjacent boards together. That element may include a spacer of length substantially equal to the space between face-to-face boards which is positioned between the boards and a fastener is passed through each spacer and the adjacent boards for a mechanically holding the adjacent boards together. The fastener may for example be a threaded post and nut or may be a swagged post. Stand-offs may also be utilized as the elements. There is preferably at least one of the elements on each side of the assembly for each pair of face-to-face boards.

The foregoing and other objects, features and advantages of the invention will be apparent from the following more particular description of a preferred embodiment of the invention as illustrated in the accompanying drawings.

IN THE DRAWINGS

DETAILED DESCRIPTION

Figure 1:
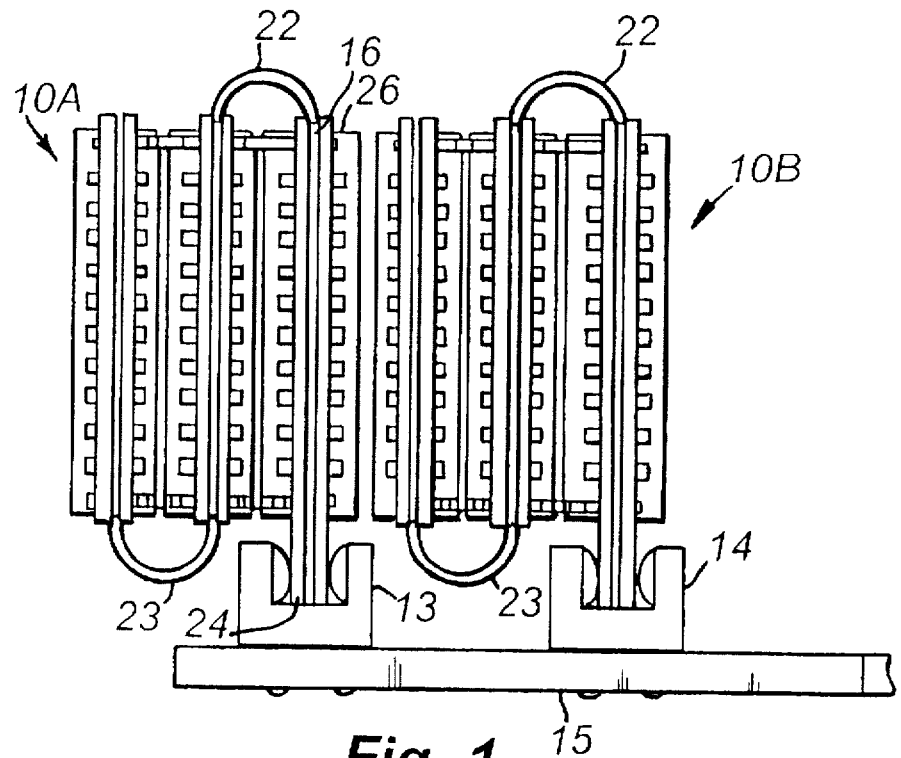
FIG. 1 is a side elevation view of electrical assemblies in accordance with the before mentioned '023 patent mounted in a mother board.

Referring again to FIGS. 1 and 2, in the prior art assembly of the '023 patent, a pair of assemblies 10A and 10B are mounted in connectors 14A, 14B respectively on a mother board 15. Each assembly 10 has a plurality of sections, three sections for the embodiment shown in FIG. 1, which sections are folded back on each other to form the assembly. The assembly has a flexible substrate 16 of an insulating material which substrate has a network of conductive leads and conducting stations formed thereon in standard fashion. Substrate 16 is initially sandwiched by a pair of circuit boards 18, 20 and portions of the boards on opposite sides of the substrate are removed to form the assembly sections, which sections are interconnected by flexible sections 22, of the flexible substrate. One end of one of the sections is elongated to form a connector comb 24 which mates with the connectors 14. Pads are provided on the circuit boards 18, 20 which are electrically interconnected to the stations on the substrate in standard fashion, such as by plated-through holes. Memory modules or other circuit components 26, generally in the form of circuit chips, are mounted to the pads on the boards. A post or wire 36 is provided on each side of the assembly for each pair of face-to-face boards which posts fit into holes or indentations 37 formed in the boards and are secured by solder 38.

Figure 2:
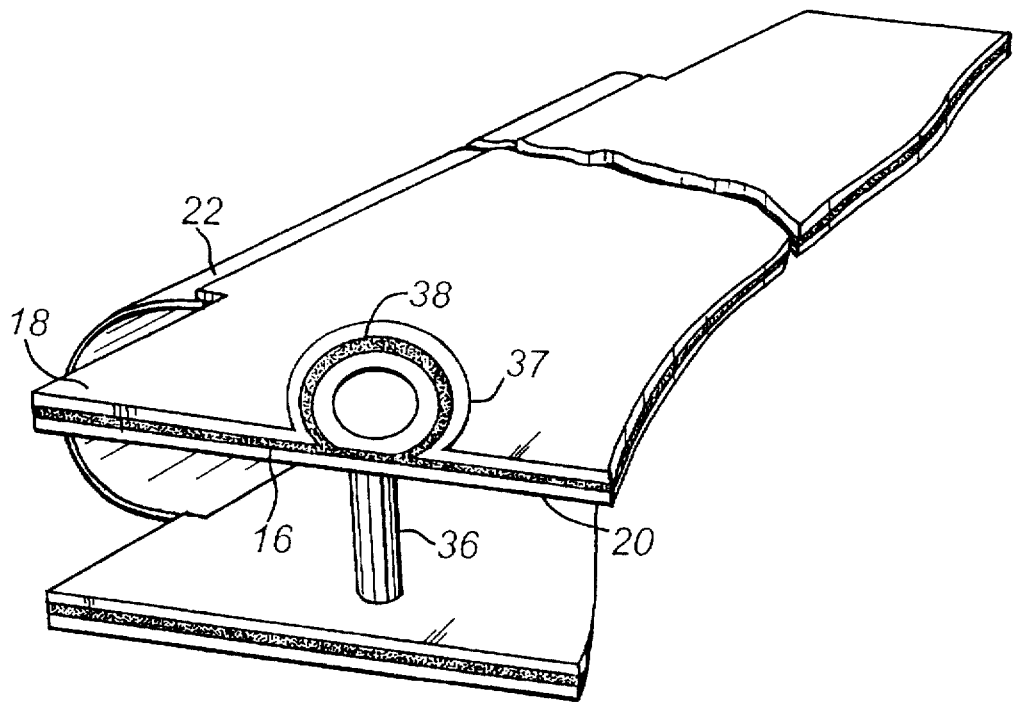
FIG. 2 is an enlarged end perspective view of the top portion of a pair of circuit board sections interconnected by a folded flexible section for the prior art assembly shown in FIG. 1.

In use, the configuration of FIGS. 1 and 2 has been found to experience some potential problems. First, the flexible portions 22 of substrate 16 project above the boards 18, 20 when the assemblies are folded as shown in FIGS. 1 and 2 and are therefore fully exposed both on their top and on their sides. As a result, these flexible portions 22 are subject to chipping, cracking, abrasion and other damage when the assemblies 10 are being handled, and in particular, when the assemblies are being inserted into and removed from a connector 14. This is because the assemblies must typically be grasped on the side for insertion and removal and, particularly on removal, the modules must be rocked back and forth while some upward pressure is applied thereto to free the combs 24 from the connectors. It is easy for the flexible connector sections 22 to have pressure applied to their sides during this operation which, if for example a finger slips, can result in damage to these flexible sections. The rocking operation require to remove boards can also cause damage to the assembly sections, to components 26 mounted thereon and/or to comb 24. A need therefore exists for an improved way of fabricating assemblies 10 so as to provide greater protection for flexible substrate portions 22 and to facilitate insertion and removal of the assemblies in a manner which is both easier to perform and less likely to cause damage to the assembly.

A second potential problem is that post or wires 36 typically have some flexibility permitting limited relative movement between the assembly sections being connected thereby, particularly when the assembly or the product containing the assembly is subjected to shock or vibration. This movement, which can sometimes be a vibratory movement, puts stress on both post 36 and solder joint 38 which may cause either of these elements to fail. Such failure may require that the assembly be disposed of; however, in view of the cost of such assemblies, the problem is typically dealt with by repairing the broken connection, something which normally must be done by hand and is therefore relatively expensive. A need therefore exists for a way to reduce or eliminate such failures.

Figure 3:
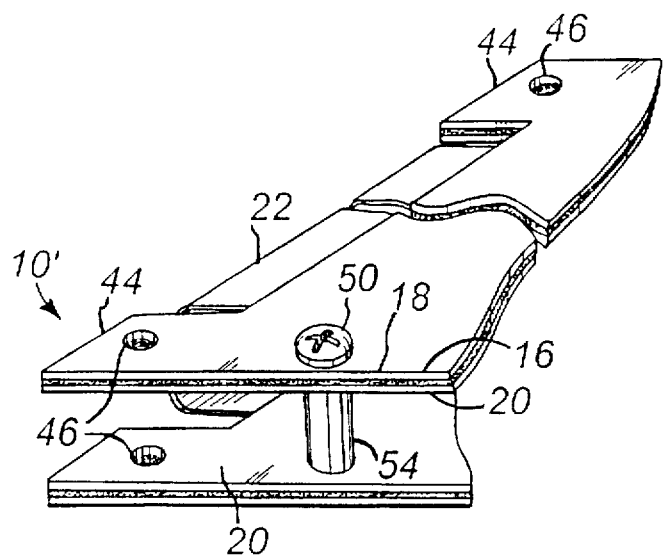
FIG. 3 is a side perspective view of the same portion of a flexible junction shown in FIG. 2 for an assembly modified in accordance with the teachings of this invention.
Figure 4:
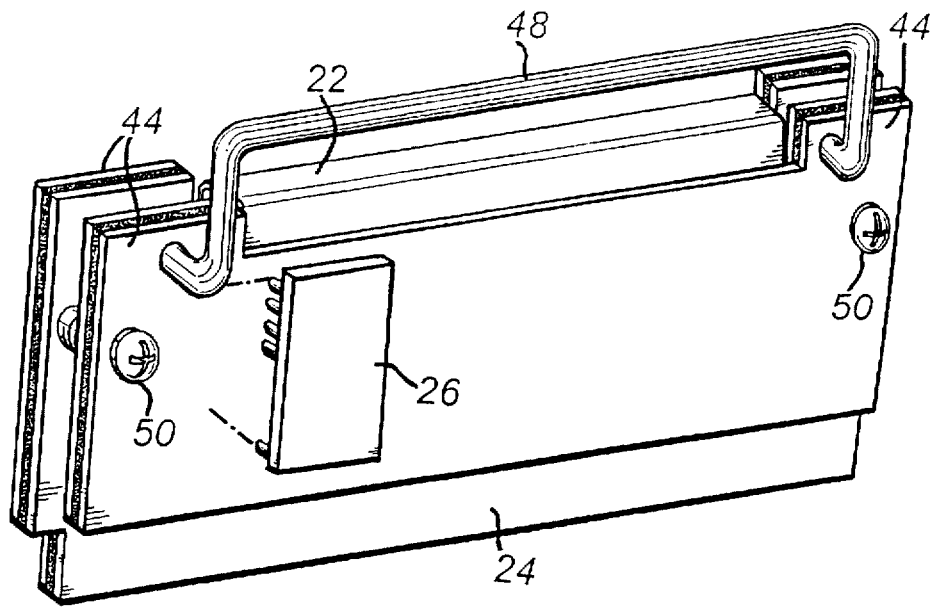
FIG. 4 is a front perspective view of a two section assembly in accordance with the teachings of this invention illustrating the use of a tool for the extraction of the assembly from a motherboard.
Figure 5:
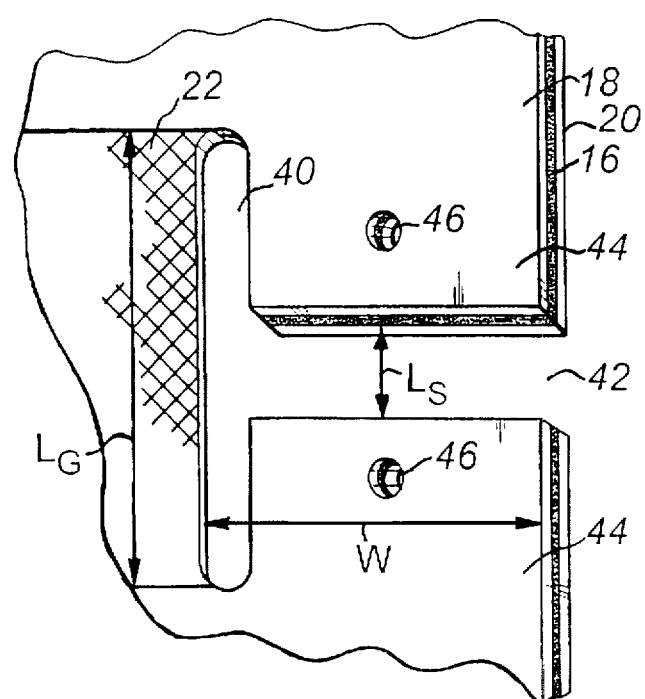
FIG. 5 is a top view of a portion of an assembly illustrating how the assembly is cut to form protective ears.

FIGS. 3–5 illustrate an improved assembly 10' in accordance with the teachings of this invention which substantially reduces or eliminates the various problems discussed above. Common elements have the same reference numerals in these figures as in FIGS. 1 and 2. Referring first to FIG. 5, it is seen that instead of the boards 18, 20 being completely removed along the entire flexible section of the assembly, as is the case for the embodiment shown in FIGS. 1 and 2, the the flexible section has three regions: (i) a center region having only flexible substrate 22 for the full length $L_G$ of the gap; (ii) a narrow region 40 on either side of the first region, the board and substrate being removed for the full length $L_G$ if the gap in this region; and (iii) a slot 42 having a length $L_S$ formed in boards 18, 20 and substrate 16 for the remaining width of the assembly in the flexible area, $L_S$ being much less than gap length $L_G$. Region 40 and slot 42 may be cut, reamed, or formed in other suitable fashion known in the art through both substrate 16 and boards 18, 20.

Forming the slot 42 as shown in FIG. 5, results in a pair of ears 44 being formed on each section of the assembly on each side of flexible substrate section 22. Since flexible section 22 has to extend for some distance to span between adjacent sections of the assembly, the height of ears 44 is therefore greater than the height of flexible substrate section 22. Thus, the ears 44 serve to protect the top of section 22 from damage since the rigid ears 44 would be contacted from the top before any contact is made with the flexible section, and to also protect the flexible sections from being cracked or broken from the sides, the ears substantially preventing contact from being made with the sides of flexible section 22.

Each ear 44 has a hole 46 formed therein which hole is adapted to have a tool 48 (FIG. 4) pass therethrough. When upward pressure is applied to the handle of tool 48, this permits assembly 10', to be withdrawn from a connector 14 relatively easily, even for large connectors having for example 168 pins, without causing damage to the assembly 10' or any component thereof. If desired, a tool 48 may also be used for insertion of assembly 10'. However, this is typically not necessary. Alternatively, the boards may be inserted and/or removed by grasping the assemblies by the ears 44 with for example, a thumb and forefinger and either pressing straight down or pulling straight up. In either event, flexible section 22 of the substrate is protected by the ears during both insertion and removal, and there is something solid to grab onto for insertion and removal other than the flexible substrate section so that these operations may be performed more quickly, easily and with less risk to the assemblies.

Finally, referring in particular to FIG. 3, the board sections are secured together by replacing posts 36 with bolts or screws 50, each of which passes through a spacer 54 formed of a rigid material such as a metal or plastic and through corresponding holes in of the board sections.

A nut or other suitable mating component is provided on the side of bolt 30 which is not shown.

Spacer 54 being substantially rigid, significantly reduces relative movement between assembly sections under conditions of shock and vibration, thereby significantly reducing the strain placed on bolt 50. While bolt 50 is preferred for holding the assembly sections together through spacer 54, this function may alternatively be accomplished by use of a spade or swag post passing through the spacer, which post is of sufficient diameter and strength to resist breakage under the environmental conditions in which the board is to be utilized. Other suitable fasteners may also be utilized in place of bolts 50. While in the discussion of above, it has been assumed that 54 is a spacer with a bolt 50 passing therethrough, the function of these two elements may be performed by a unitary stand-off. In particular, spacer portion 54 of the stand-off may either be solid as shown, or may be a pair of spaced-apart, disc-shaped projections on the stand-off element, with post portions extending from both ends of the spacer portion which may be threaded to have a nut fitted thereon or may be adapted to be spaded or swagged for securing the adjacent boards together.

Further, while the spacers or stand-offs 54 and related posts are shown somewhat below the level of the ears 44 in the figures, holes 46 could be removed, and these elements could be moved up either into the ears 44 or just below the ears in the area thereof. With this configuration, a suitable clamp or hooked tool could engage these elements and be used for extraction of the assembly. Further, depending on the tool utilized, other components may be either formed in or mounted in the ears or in the area thereof to facilitate the extraction of the assembly, and possibly the insertion thereof.

As mentioned earlier, while combs 24 can be the connectors as shown for the preferred embodiments, this is by no means a limitation on the invention and other suitable connectors may be employed while still remaining within the scope of the invention. Further, while single-layer, rigid-flex boards have been utilized for the illustrative embodiments, this is also not a limitation on the invention and the invention may also be practiced with multi-leveled rigid-flex boards. With multi-level rigid-flex boards, ears 44 may be formed only for the outermost boards of the assembly or may formed for the entire assembly. The later configuration is preferable since it is easier to fabricate and provides, stronger, more rigid ears. Further, while the flexible substrate 22 has been shown for the preferred embodiment as extending for the full width of the assembly, and being cut back only in the flexible areas, it is possible, but not preferable, to form the boards with the flexible substrates having only the width of the flexible portions 22. The rigid sections also do not need to be of substantially the same length as shown in the figures, and rigid sections of variable lengths may be employed in appropriate applications. Finally, where exceptionally high speed is required, the flow path from connecting comb 24 to components at ends of the assembly remote from the connector may become a factor in operating speed, for example, for memory retrievals. For such very high speed operations, it may therefore be desirable to provide electrical connections between adjacent face-to-face boards in selected locations to reduce the length of these electrical flow paths.

An improved electronic assembly is thus provided which overcomes the varies problems discussed earlier for the prior art assemblies. While the invention has been shown and described above with reference to a preferred embodiment, and various modifications on the preferred embodiment have been discussed, it is apparent that these and other modifications may be made in the invention by one skilled in the art while still remaining within the spirit and scope of the invention which is to be defined only by the appended claims.

What is claimed is:

1. An electronic assembly to be mounted in a corresponding connector on a mother board, the assembly having at least one flexible insulating substrate with a network of conductive leads and connecting stations formed thereon, at least first and second substantially rigid circuit boards sandwiching at least said substrate therebetween, each of said boards having pads for selectively mounting electronic components, a connecting element at one end of the assembly which is sized to mate with said connectors, electrical connections selectively established between said pads and stations on said substrate, at least one gap being formed in each of the circuit boards, gaps in the boards being aligned to form a flexible section long enough to allow mounting of said boards in a parallel, face-to-face, layered arrangement by folding said substrate at each said gap, characterized in that foldable substrates in said flexible regions are narrower on each side thereof then said boards, said gaps being of full length for the width of the foldable substrate and slightly beyond and otherwise being of much shorter length, so as to provide a pair of rigid ears formed on both sides of said gap and on either side of the foldable substrate, which ears extend above the height of a folded substrate at the gap and protect the folded substrate.

2. The assembly as claimed in claim 1, including an element in the area of at least selected ones of said ears which is adapted to coact with a suitable tool to facilitate the removal of the assembly from said connector.

3. The assembly as claimed in claim 2, wherein the element is a hole formed each of said ears.

4. The assembly as claimed in claim 2, wherein the element includes a post extending between adjacent boards and attached to each board in the area of said ears.

5. The assembly as claimed in claim 1, including at least one element for maintaining a selected spacing between adjacent face-to-face boards and for mechanically holding the adjacent boards together.

6. The assembly as claimed in claim 5, wherein said element for maintaining includes at least one spacer of length substantially equal to the space between adjacent face-to-face boards positioned between the boards, and a fastener passing through each spacer and the adjacent boards for mechanically holding the adjacent boards together.

7. The assembly as claimed in claim 6, wherein said fastener is a threaded bolt and nut pair.

8. The assembly as claimed in claim 6, wherein said fastener is a swagged post.

9. The assembly as claimed in claim 5, wherein said element for maintaining includes at least one stand-off of length substantially equal to the space between adjacent face-to-face boards positioned between the boards, said at least one stand-off mechanically holding adjacent boards together.

10. The assembly as claimed in claim 5, wherein there is at least one of said elements on each side of said assembly for each pair of face-to-face boards.

11. The assembly as claimed in claim 1, wherein said boards sandwich said substrate and are attached thereto.

12. An electronic assembly to be mounted in a corresponding connector on a mother board, the assembly having at least one flexible insulating substrate with a network of conductive leads and connecting stations formed thereon, at least first and second substantially rigid circuit boards sandwiching at least said substrate therebetween, each of said boards having pads for selectively mounting electronic components, a connecting element at one end of the assembly which is sized to mate with said connectors, electrical connections being suitably established between said pads and stations on said substrate, at least one gap being formed in each of the circuit boards, gaps in the boards being aligned to form a flexible region long enough to allow mounting of said boards in a parallel, face-to-face, layered arrangement by folding said substrate at each said gap, characterized by at least one element for maintaining a selected spacing between adjacent face-to-face boards and for mechanically holding the adjacent boards together.

13. An assembly as claimed in claim 12, wherein said element for maintaining includes at least one spacer of length substantially equal to the space between adjacent face-to-face boards positioned between the boards, and a fastener passing through each spacer and the adjacent boards, for mechanically holding the adjacent boards together.

14. The assembly as claimed in claim 13, wherein said fastener is a threaded bolt and nut pair.

15. The assembly as claimed in claim 13, wherein said fastener is a swagged post.

16. The assembly as claimed in claim 12, wherein there is at least one of said elements on each side of said assembly for each pair of face-to-face boards.

17. An assembly as claimed in claim 12, wherein said element for maintaining includes at least one stand-off of length substantially equal to the space between adjacent face-to-face boards positioned between the boards, said at least one stand-off mechanically holding adjacent boards together.

18. A method for fabricating an electronic assembly to be mounted in a corresponding connector on a mother board, the method including the steps of:

(a) providing at least one flexible insulating substrate with a network of conductive leads and connecting stations formed thereon;

(b) sandwiching at least said substrate between first and second substantially rigid circuit boards, each of said boards having pads for selectively mounting electronic components;

(c) forming a connecting element at one end of the assembly which is sized to mate with said connectors;

(d) forming suitable electrical connections between said pads and stations on said substrate; and (e) forming at least one gap in each of the circuit boards, gaps in the boards being aligned on opposite sides of the substrate to form a flexible region long enough to allow mounting of said boards in a parallel, face-to-face, layered arrangement by folding said substrate at each said gap, foldable substrates in said flexible regions being narrower on each side thereof then said boards, said gaps being of full length for the width of the foldable substrate, being of full length and not including the substrate for a narrow region on either side of the foldable substrate, and otherwise being of much shorter length, so as to provide a pair of rigid ears formed on both sides of said gap and on either side of a folded substrate, which ears extend above the height of the folded substrate at the gap and protect the folded substrate.

19. A method as claimed in claims 18, including the step of providing an element in the area of at least selected ones of said ears which is adapted to coact with a suitable tool to facilitate the removal of the assembly from said connector.

* * * * *